(12) United States Patent
Zhang

(10) Patent No.: US 12,080,758 B2
(45) Date of Patent: Sep. 3, 2024

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Weichao Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 410 days.

(21) Appl. No.: 17/454,871

(22) Filed: Nov. 15, 2021

(65) Prior Publication Data
US 2022/0302253 A1 Sep. 22, 2022

Related U.S. Application Data

(63) Continuation of application No. PCT/CN2021/111829, filed on Aug. 10, 2021.

(30) Foreign Application Priority Data
Mar. 18, 2021 (CN) .......................... 202110291828.7

(51) Int. Cl.
*H01L 29/06* (2006.01)
*H01L 21/02* (2006.01)
(Continued)

(52) U.S. Cl.
CPC ...... *H01L 29/0649* (2013.01); *H01L 21/0228* (2013.01); *H01L 21/3212* (2013.01);
(Continued)

(58) Field of Classification Search
CPC ...... H10B 12/30; H10B 12/488; H10B 12/34; H10B 12/053; H10B 12/315;
(Continued)

(56) References Cited

U.S. PATENT DOCUMENTS

| 8,618,602 B2 | 12/2013 | Oyu |
| 8,975,140 B2 | 3/2015 | Chung |

(Continued)

FOREIGN PATENT DOCUMENTS

| CN | 104425278 A | 3/2015 |
| CN | 108305876 A | 7/2018 |

(Continued)

OTHER PUBLICATIONS

European Search Report cited in EP21908076.9, mailed Jul. 26, 2023, 10 pages.

(Continued)

*Primary Examiner* — Mouloucoulaye Inoussa
(74) *Attorney, Agent, or Firm* — Kilpatrick Townsend & Stockton LLP

(57) ABSTRACT

The present disclosure provides a manufacturing method of a semiconductor structure and a semiconductor structure. The manufacturing method of a semiconductor structure includes: providing a substrate, the substrate includes active regions and isolation regions, each of the isolation regions includes a first trench and an isolation layer formed in the first trench; removing part of the isolation layer to form first grooves; forming a first mask layer, the first mask layer covers upper surfaces of the active regions and fills the first grooves; planarizing the first mask layer, such that an upper surface of a portion of the first mask layer located above the active regions is flush with an upper surface of a portion of the first mask layer located above the isolation regions; removing part of the first mask layer, part of the isolation layer, and part of the substrate, to form second trenches and third trenches.

19 Claims, 7 Drawing Sheets

(51) Int. Cl.
*H01L 21/321* (2006.01)
*H01L 21/764* (2006.01)
*H10B 12/00* (2023.01)

(52) U.S. Cl.
CPC .......... *H01L 21/764* (2013.01); *H10B 12/30* (2023.02); *H10B 12/488* (2023.02)

(58) Field of Classification Search
CPC .............. H01L 29/0649; H01L 21/308; H01L 21/0334; H01L 29/42376; H01L 21/764; H01L 21/3212; H01L 21/0228; H01L 21/28114; H01L 21/47573; H01L 21/0229; H01L 21/76224; H01L 29/7825; H01L 29/66734; H01L 29/4236; H01L 29/7813; H01L 29/7827; H01L 29/66666; H01L 29/41741; H01L 29/7831; H01L 2221/1057
USPC .................. 438/589, 430; 257/21.19, 21.546
See application file for complete search history.

(56) References Cited

U.S. PATENT DOCUMENTS

| | | | |
|---|---|---|---|
| 10,615,164 | B2 | 4/2020 | Kim et al. |
| 11,264,391 | B1* | 3/2022 | Shih ..................... H10B 12/488 |
| 2004/0192060 | A1 | 9/2004 | Stegemann et al. |
| 2008/0146002 | A1 | 6/2008 | Kang et al. |
| 2009/0130818 | A1* | 5/2009 | Lin .................. H01L 21/76224 |
| | | | 438/424 |
| 2010/0219470 | A1 | 9/2010 | Baek |
| 2011/0003468 | A1* | 1/2011 | Song .................. H01L 29/4236 |
| | | | 438/589 |
| 2011/0133261 | A1* | 6/2011 | Kim ....................... H10B 12/09 |
| | | | 257/296 |
| 2012/0161227 | A1 | 6/2012 | Oyu |
| 2013/0087853 | A1* | 4/2013 | Kim .................... H01L 29/7851 |
| | | | 257/330 |
| 2014/0154882 | A1* | 6/2014 | Kim ..................... H10B 12/482 |
| | | | 438/672 |
| 2015/0111360 | A1* | 4/2015 | Kim ..................... H10B 12/315 |
| | | | 438/381 |
| 2017/0005166 | A1* | 1/2017 | Park .................... H10B 12/482 |
| 2018/0130702 | A1* | 5/2018 | Patil .................. H01L 23/53209 |
| 2018/0197868 | A1 | 7/2018 | Lin et al. |
| 2019/0096993 | A1* | 3/2019 | Sun .................... H01L 27/0886 |
| 2020/0168611 | A1 | 5/2020 | Jeon et al. |

FOREIGN PATENT DOCUMENTS

| | | |
|---|---|---|
| CN | 110534480 A | 12/2019 |
| CN | 110896076 A | 3/2020 |
| CN | 112447605 A | 3/2021 |
| JP | 2012134395 A | 7/2012 |
| KR | 20070002118 A | 1/2007 |
| KR | 20090044855 A | 5/2009 |
| KR | 20090068714 A | 6/2009 |

OTHER PUBLICATIONS

JP Office Action cited in JP2022-541010, mailed Aug. 25, 2023, 8 pages.
International Search Report cited in PCT/CN2021/111829, mailed Dec. 15, 2021, 9 pages.
State Intellectual Property Office of the People's Republic of China, First Office Action and Search Report Issued in Application No. 202110291828.7, Apr. 12, 2024, 8 pages.

* cited by examiner

MANUFACTURING METHOD OF SEMICONDUCTOR STRUCTURE AND SEMICONDUCTOR STRUCTURE

CROSS-REFERENCE TO RELATED APPLICATIONS

The present disclosure is a continuation application of International Patent Application No. PCT/CN2021/111829, titled "MANUFACTURING METHOD OF SEMICONDUCTOR STRUCTURE AND SEMICONDUCTOR STRUCTURE" and filed on Aug. 10, 2021, which claims the priority of Chinese Patent Application No. 202110291828.7, titled "MANUFACTURING METHOD OF SEMICONDUCTOR STRUCTURE AND SEMICONDUCTOR STRUCTURE" and filed on Mar. 18, 2021. The entire contents of International Patent Application No. PCT/CN2021/111829 and Chinese Patent Application No. 202110291828.7 are incorporated herein by reference.

TECHNICAL FIELD

The present disclosure relates to the technical field of semiconductors, and in particular to a manufacturing method of a semiconductor structure and a semiconductor structure.

BACKGROUND

There is hardware vulnerability in the existing DRAM semiconductor structure. That is, high frequency access or attacks to a row of data in the memory can cause bit flipping in adjacent rows of data. The vulnerability elevates access permission to the entire memory area. As the manufacturing precision of DRAMs increases, physical space occupied by the components becomes smaller. When a single chip has a large memory capacity, electromagnetic interference between memory cells is unavoidable.

For a DRAM semiconductor structure, bit flipping is mainly caused by the impact of word lines formed in an adjacent isolation region (i.e., passing word lines) on word lines formed in an active region (i.e., active word lines). In the actual operation of the DRAM, it is the active word lines that really play a role. In order to reduce the effect of bit flipping, the distance between two word line structures can be increased by reducing the width of the passing word line. However, the existing passing word lines and active word lines are formed at the same time, and it is difficult to produce a large size difference through existing processes such as etching.

SUMMARY

According to an aspect, embodiments of the present disclosure provide a manufacturing method of a semiconductor structure, including: providing a substrate, where the substrate includes active regions and isolation regions, each of the isolation regions includes a first trench and an isolation layer formed in the first trench, and a sacrificial layer is provided on the active regions; removing part of the isolation layer to form first grooves; forming a first mask layer, where the first mask layer covers upper surfaces of the active regions and fills the first grooves; planarizing the first mask layer, such that an upper surface of a portion of the first mask layer located above the active regions is flush with an upper surface of a portion of the first mask layer located above the isolation regions; removing part of the first mask layer, part of the isolation layer, and part of the substrate, to form second trenches and third trenches, where each of the second trenches is located in each of the isolation regions, each of the third trenches is located in each of the active regions, and a width of the third trench is greater than a width of the second trench; and forming word line structures in the second trenches and the third trenches.

According to another aspect, embodiments of the present disclosure provide a semiconductor structure, including: a substrate, second trenches and third trenches, and word line structures, where the substrate includes active regions and isolation regions, each of the isolation regions includes a first trench and an isolation layer formed in the first trench; each of the second trenches is located in each of the isolation regions, each of the third trenches is located in each of the active regions, and a width of the third trench is greater than a width of the second trench; and the word line structures are provided in the second trenches and the third trenches.

DETAILED DESCRIPTION

Figure 1:
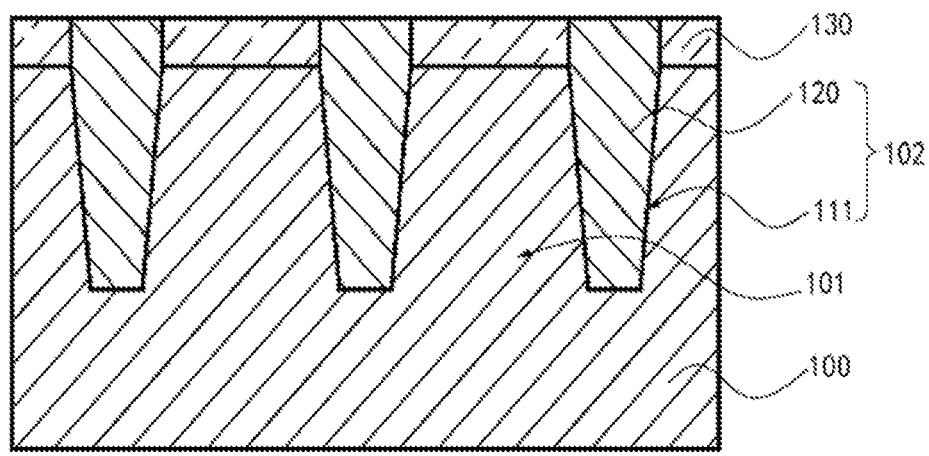
FIG. 1 to FIG. 9 are schematic diagrams of a semiconductor structure in some steps of a manufacturing method proposed by the present disclosure.

Exemplary embodiments will be described below in further detail with reference to the accompanying drawings. The exemplary embodiments may be implemented in various forms, and may not be construed as being limited to those described herein. On the contrary, these exemplary embodiments are provided to make the present disclosure comprehensive and complete and to fully convey the concept manifested therein to those skilled in the art. The same reference numerals in the figures indicate the same or similar structures, and thus their detailed descriptions will be omitted.

FIG. 1 to FIG. 9 and FIG. 11 representatively show schematic diagrams of a semiconductor structure in some steps of a manufacturing method of a semiconductor structure proposed by the present disclosure. In the exemplary embodiment, the manufacturing method of a semiconductor structure proposed by the present disclosure is described by taking its application to a semiconductor structure such as DRAM as an example. It is understandable for those skilled in the art that, in order to apply the relevant design of the present disclosure to other types of semiconductor structures or other processes, various modifications, additions, substitutions deletions or other changes may be made to the following specific embodiments, but such changes are still within the scope of the principle of the manufacturing method of a semiconductor structure proposed by the present disclosure.

As shown in FIG. 1 to FIG. 13, in this embodiment, the manufacturing method of a semiconductor structure proposed by the present disclosure includes:

providing a substrate 100, where the substrate 100 includes active regions 101 and isolation regions 102, each of the isolation regions 102 includes a first trench 111 and an isolation layer 120 formed in the first trench 111, and a sacrificial layer 130 is provided on the active regions 101;

removing part of the isolation layer 120 to form first grooves 210;

forming a first mask layer 300, where the first mask layer 300 covers upper surfaces of the active regions 101 and fills the first grooves 210;

planarizing the first mask layer 300, such that an upper surface of a portion of the first mask layer 300 located above the active regions 101 is flush with an upper surface of a portion of the first mask layer 300 located above the isolation regions 102;

removing part of the first mask layer 300, part of the isolation layer 120, and part of the substrate 100, to form second trenches 112 and third trenches 113, where each of the second trenches 112 is located in each of the isolation regions 102, each of the third trench 113 is located in each of the active regions 101, and a width of the third trench 113 is greater than a width of the second trench 112; and forming word line structures in the second trenches 112 and the third trenches 113.

Through the design above, the present disclosure can make the mask thickness of the active regions 101 thinner than that of the isolation regions 102, such that the width of the word line trench formed in the isolation region 102 is less than the width of the word line trench formed in the active region 101 in the subsequent process, and the width of a passing word line 702 is less than that of an active word line 701, thereby reducing the impact of the passing word line 702 and the adverse influence of bit flipping.

FIG. 1 shows a schematic structural diagram of the semiconductor structure in the step of "providing a substrate 100". Specifically, the semiconductor structure in this step includes the substrate 100 (which is a Si substrate) and the isolation layer 120. The substrate 100 includes the active regions 101 and the isolation regions 102. The isolation region 102 includes the first trench 111 and the isolation layer 120. The isolation layer 120 is formed in the first trench 111, and the sacrificial layer 130 is provided on the upper surfaces of the active regions 101. On this basis, the first trench 111 is opened on the upper surface of the sacrificial layer 130, and the upper surface of the isolation layer 120 is flush with the upper surface of the sacrificial layer 130.

In one of the embodiments, in the step of "providing a substrate 100", in this embodiment, a material of the isolation layer 120 may include $SiO_2$.

In one of the embodiments, in the step of "providing a substrate 100", in this embodiment, a material of the sacrificial layer 130 may include $Si_3N_4$.

Figure 2:
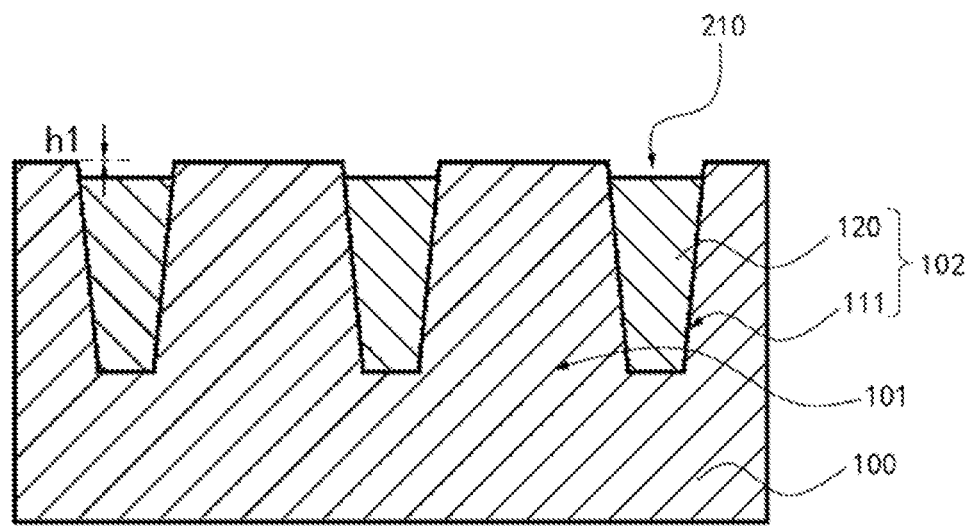

FIG. 2 shows a schematic structural diagram of the semiconductor structure in the step of "forming first grooves 210". Specifically, the semiconductor structure in this step includes the substrate 100 and the remaining isolation layer 120 after partial removal. The first grooves 210 are formed at positions of the removed isolation layer 120, and the sacrificial layer 130 is removed at the same time when part of the isolation layer 120 is removed. After part of the isolation layer 120 is removed, the upper surface of the isolation layer 120 is lower than the upper surface of the substrate 100, thereby forming the first grooves 210. That is, the bottom wall of each of the first grooves 210 is defined by the upper surface of the remaining isolation layer 120 after partial removal, and the sidewalls of each of the first grooves 210 are defined by partial trench wall of each of the first trenches 111 exposed due to the removal process.

In one of the embodiments, as shown in FIG. 2, in the step of "forming first grooves 210", in this embodiment, the sacrificial layer 130 and part of the isolation layer 120 may be removed by a dry etching process.

In one of the embodiments, as shown in FIG. 2, in the step of "forming first grooves 210", in this embodiment, a depth h1 of the first groove 210 may be 3 nm to 10 nm, such as 3 nm, 5 nm, 8 nm, 10 nm, etc. In other embodiments, the depth h1 of the first groove 210 may also be less than 3 nm or greater 10 nm, such as 2.5 nm, 11 nm, etc., which is not limited by this embodiment.

Figure 3:
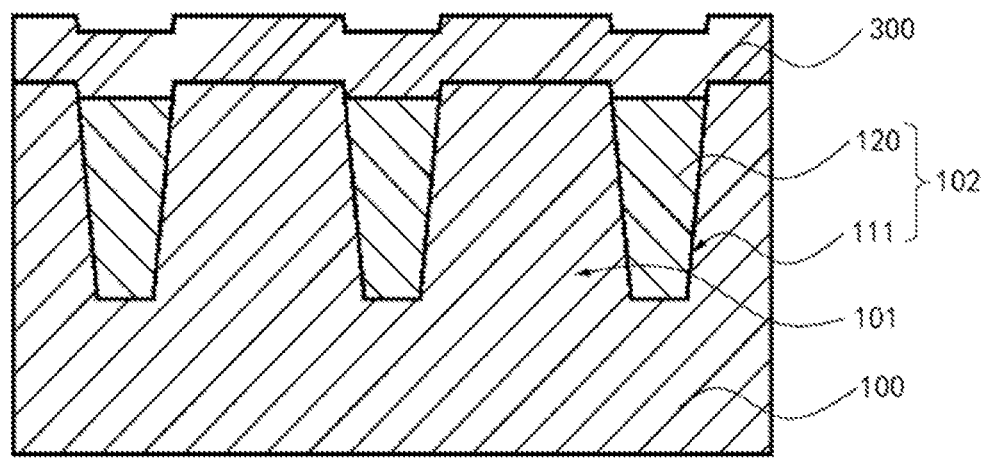

FIG. 3 shows a schematic structural diagram of the semiconductor structure in the step of "forming first mask layer 300". Specifically, the semiconductor structure in this step includes the substrate 100, the isolation layer 120, and the first mask layer 300. The first mask layer 300 covers the upper surfaces of the active regions 101, and the first mask layer 300 fills the first grooves 210. In other words, the first mask layer 300 also covers the upper surface of the isolation layer 120 and exposed partial sidewalls of each of the first trenches 111.

In one of the embodiments, as shown in FIG. 3, in the step of "forming a first mask layer 300", in this embodiment, a material of the first mask layer 300 may include $Si_3N_4$.

In one of the embodiments, as shown in FIG. 3, in the step of "forming a first mask layer 300", in this embodiment, the first mask layer 300 may be formed by an atomic layer deposition process.

Figure 4:
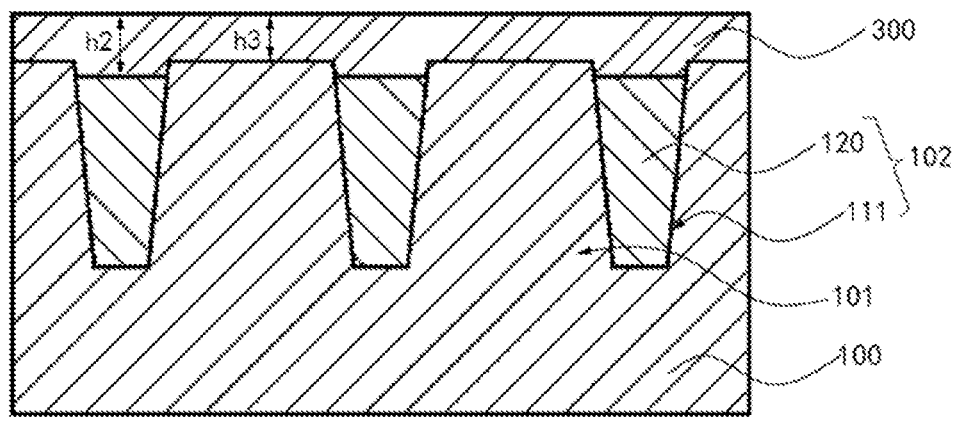

In one of the embodiments, as shown in FIG. 3 and FIG. 4, in the step of "forming a first mask layer 300", in this embodiment, the thickness of the first mask layer 300 before planarizing is 15 nm to 30 nm, such as 15 nm, 20 nm, 25 nm, 30 nm, etc. In other embodiments, the thickness of the first mask layer 300 before planarizing may also be less than 15 nm or greater than 30 nm, such as 14 nm, 35 nm, etc., which is not limited to this embodiment. In addition, the depth h1 of the first groove 210 is 3 nm to 10 nm. Taking the thickness of the first mask layer 300 before planarizing being 15 nm to 30 nm as an example, after the first mask layer 300 is planarized, a second thickness h3 of a portion of the first mask layer 300 which covers the active regions 101 is approximately 5 nm to 27 nm, and a first thickness h2 of a portion of the first mask layer 300 which covers the isolation layer 120 still maintains the thickness of the first mask layer 300 before planarizing, that is, 15 nm to 30 nm.

FIG. 4 shows a schematic structural diagram of the semiconductor structure in the step of "planarizing the first mask layer 300". Specifically, the semiconductor structure in this step includes the substrate 100, the isolation layer 120, and the first mask layer 300 with a planarized upper surface. The upper surface of the first mask layer 300 is roughly planar after planarizing. That is, in the first mask layer 300, the upper surface of a portion corresponding to the active regions 101 is flush with the upper surface of a portion corresponding to the isolation regions 102 (the first trenches 111). On this basis, the portion of the first mask layer 300 which corresponds to the isolation regions 102 fills the first trenches 111. Therefore, the first thickness h2 of this portion of the first mask layer 300 is greater than the second thickness h3 of the portion corresponding to the active regions 101.

In one of the embodiments, as shown in FIG. 4, in the step of "planarizing the first mask layer 300", in this embodiment, the upper surface of the first mask layer 300 may be planarized through a chemical-mechanical polishing (CMP) process.

FIG. 5 to FIG. 9 show schematic structural diagrams of the semiconductor structure in several steps for "forming second trenches 112 and third trenches 113". Specifically, the step of "forming second trenches 112 and third trenches 113" may specifically include:

forming a second mask layer 400 on the first mask layer 300, where the second mask layer 400 covers the surface of the first mask layer 300;

forming a patterned photoresist layer 600 on the second mask layer 400; and etching part of the first mask layer 300, part of the isolation layer 120, and part of the substrate 100 by using the photoresist layer 600 as a mask.

Figure 6:
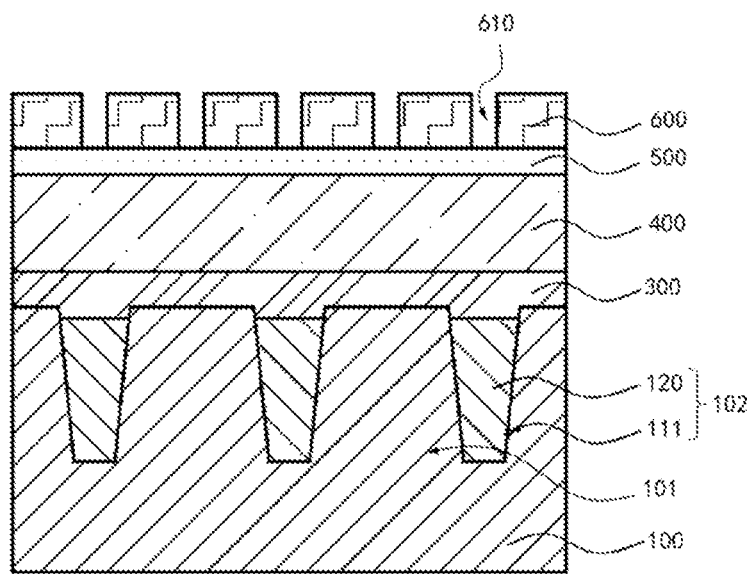

Further, in this embodiment, the step of forming a patterned photoresist layer 600 on the second mask layer 400 includes:

forming a photoresist material layer on the second mask layer; and as shown in FIG. 6, removing part of the photoresist material layer 601 by using an exposure and development technology, where the remaining photoresist material layer 601 forms the photoresist layer 600.

Figure 5:
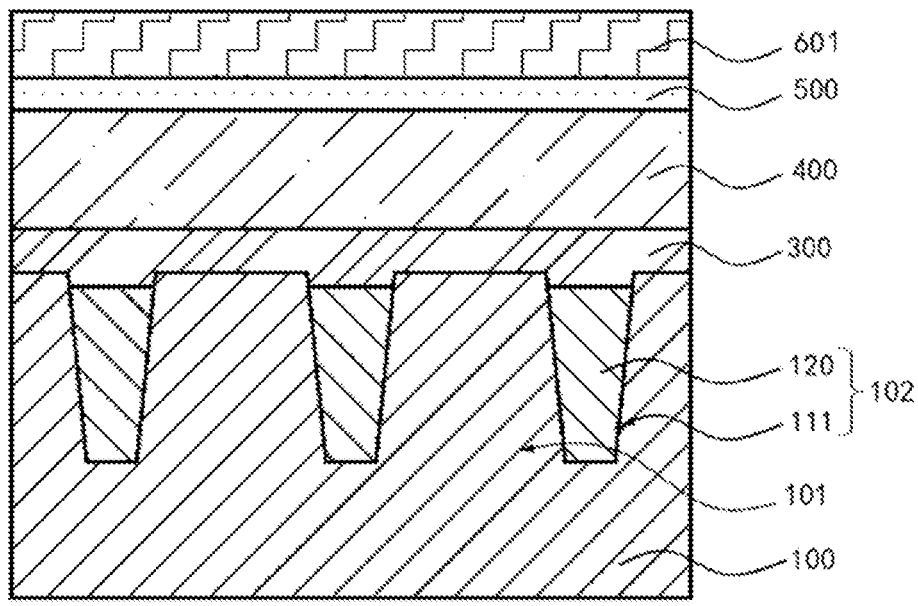

Further, as shown in FIG. 5 and FIG. 6, in this embodiment, a dielectric layer 500 may be formed on the second mask layer 400, where the dielectric layer 500 covers the upper surface of the second mask layer 400. On this basis, in the step of "forming a photoresist material layer 601", the photoresist material layer 601 covers the upper surface of the dielectric layer 500. In other embodiments, the photoresist material layer 601 may also be formed on the second mask layer 400 by other processes, and can directly cover the upper surface of the second mask layer 400, or spaced by other structures such as the dielectric layer 500 in this embodiment.

FIG. 5 representatively shows a schematic structural diagram of the semiconductor structure in the step of "forming a photoresist material layer 601". Specifically, the semiconductor structure in this step includes the substrate 100, the isolation layer 120, the first mask layer 300, the second mask layer 400, the dielectric layer 500, and the photoresist material layer 601. The second mask layer 400 is formed on the upper surface of the first mask layer 300. The dielectric layer 500 is formed on the upper surface of the second mask layer 400. The photoresist material layer 601 is coated on the upper surface of the dielectric layer 500.

FIG. 6 representatively shows a schematic structural diagram of the semiconductor structure in the step of "forming a photoresist layer 600". Specifically, the semiconductor structure in this step includes the substrate 100, the isolation layer 120, the first mask layer 300, the second mask layer 400, the dielectric layer 500, and the pattered photoresist layer 600. The second mask layer 400 is formed on the upper surface of the first mask layer 300. The dielectric layer 500 is formed on the upper surface of the second mask layer 400. The photoresist layer 600 is coated on the upper surface of the dielectric layer 500, and the dielectric layer 500 may be used as an underlying layer in the exposure process. The patterned photoresist layer 600 is provided with openings 610. The openings 610 correspond to positions of the subsequently formed second trenches 112 and third trenches 113 (i.e., positions of the word line structures) in a one-to-one manner. Widths of the openings 610 are approximately the same.

In one of the embodiments, as shown in FIG. 5, in the step of "forming a second mask layer 400", in this embodiment, a material of the second mask layer 400 may include carbon (C).

In one of the embodiments, as shown in FIG. 5, in the step of "forming a second mask layer 400", in this embodiment, the second mask layer 400 may be formed by a chemical vapor deposition process.

In one of the embodiments, as shown in FIG. 5, in the step of "forming a second mask layer 400", in this embodiment, a thickness of the second mask layer 400 may be 150 nm to 200 nm, such as 150 nm, 160 nm, 175 nm, 200 nm, etc. In other embodiments, the thickness of the second mask layer 400 may also be less than 150 nm or greater than 200 nm, such as 140 nm, 210 nm, and the like, which is not limited in this embodiment.

In one of the embodiments, as shown in FIG. 5, in the step of "forming a dielectric layer 500", in this embodiment, a material of the dielectric layer 500 may include Si, $Si_3N_4$ or SiON.

Figure 7:
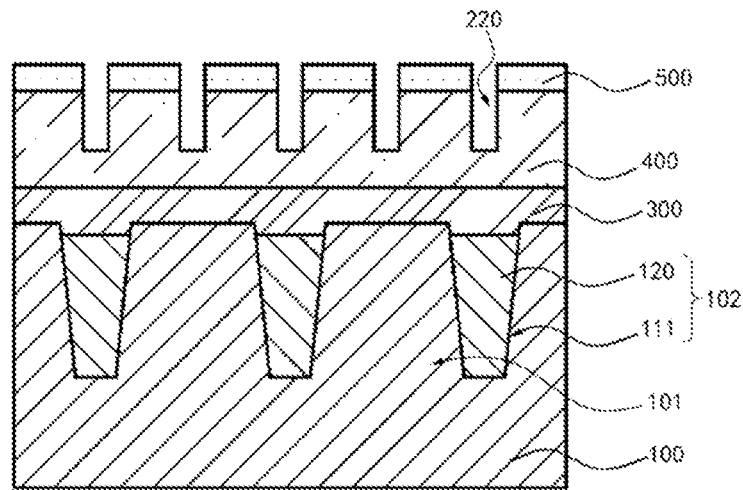
Figure 8:
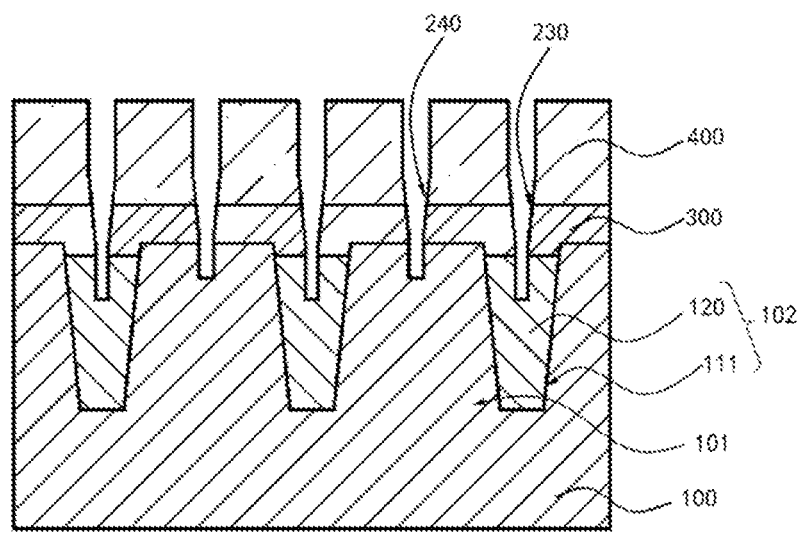
Figure 9:
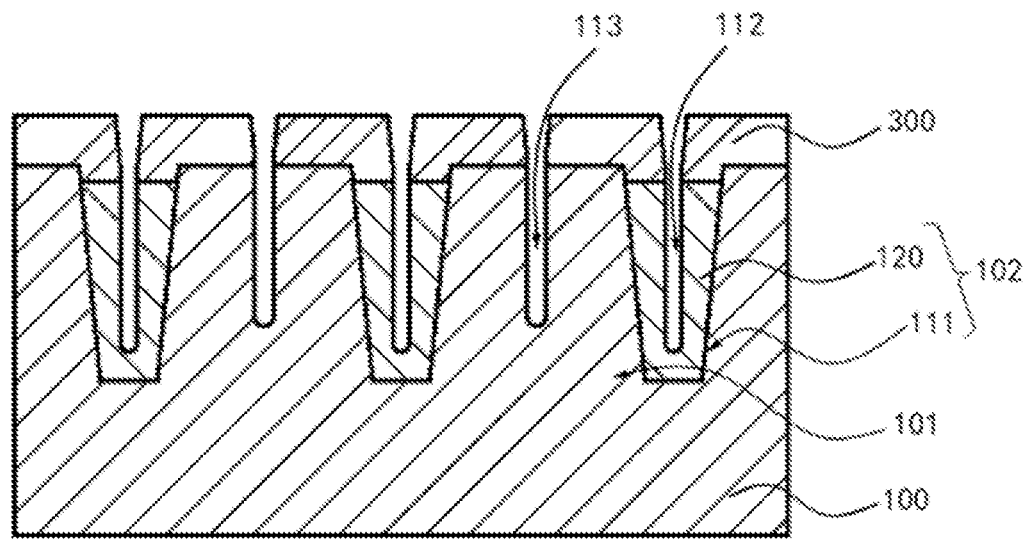

Further, as shown in FIG. 7 to FIG. 9, in this embodiment, the step of etching part of the first mask layer 300, part of the isolation layer 120, and part of the substrate 100 by using the photoresist layer 600 as a mask includes:

etching part of the second mask layer 400 by using the photoresist layer 600 as a mask, to form fourth trenches 220 in the second mask layer 400;

removing the photoresist layer 600;

etching part of the first mask layer 300, part of the isolation layer 120, and part of the substrate 100 downward along the fourth trenches 220; and removing the second mask layer 400.

FIG. 7 shows a schematic structural diagram of the semiconductor structure in the step of "forming fourth trenches 220". Specifically, the semiconductor structure in this step includes the substrate 100, the isolation layer 120, the first mask layer 300, the remaining second mask layer 400 after partial removal, and the remaining dielectric layer 500 after partial removal. By using the patterned photoresist layer 600 as a mask, the patterns of the openings 610 of the photoresist layer 600 are transferred to the dielectric layer 500 and part of the second mask layer 400, and the photoresist layer 600 is completely removed in the exposure process. The formed fourth trenches 220 are opened on the upper surface of the dielectric layer 500, and extend to the second mask layer 400.

FIG. 8 shows a schematic structural diagram of the semiconductor structure in the step of "forming third grooves 230 and fourth grooves 240". Specifically, the semiconductor structure in this step includes the active regions 101, the remaining substrate 100 after partial removal, the remaining isolation layer 120 after partial removal, the remaining first mask layer 300 after partial removal, and the remaining second mask layer 400 after further partial removal. The second mask layer 400, the first mask layer 300, the active regions 101, and the isolation layer 120 are continuously etched from the bottom of each of the fourth trenches 220. Moreover, by using a spacing multiplication process, the cross section of each channel formed in the first mask layer 300 in the etching process is in a shape of a trapezoid with a decreasing width from top to bottom. The first thickness h2 of the portion of the first mask layer 300 covering the isolation layer 120 (i.e., the portion filling the first grooves 210) is greater than the second thickness h3 of the portion covering the active regions 101. Therefore, an opening width of the channel with the trapezoidal cross section on the upper surface of the active region 101 is greater than its opening width on the upper surface of the isolation layer 120, such that the width of the fourth groove 240 formed, by etching downward from the opening, in the active region 101 is greater than the width of the third groove 230 in the isolation layer 120. In other words, the third groove 230 is formed under the fourth trench 220 located in the isolation layer 120, and the fourth groove 240 is formed under the fourth trench 220 located in the active region 101.

Figure 10:
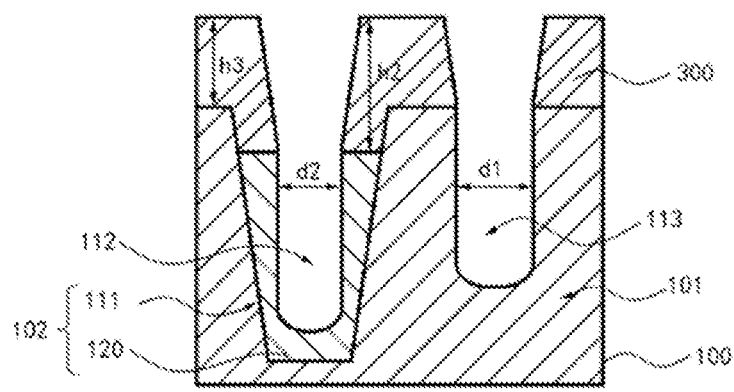
FIG. 10 is a partial enlarged view of the semiconductor structure in the step shown in FIG. 9.

As shown in FIG. 9 and FIG. 10, FIG. 9 shows a schematic structural diagram of the semiconductor structure in the step of "forming second trenches 112 and third trenches 113", and FIG. 10 representatively shows a partial enlarged view of the semiconductor structure in FIG. 9. Specifically, the semiconductor structure in this step includes the active regions 101, the remaining substrate 100 after further partial removal, the remaining isolation layer 120 after further partial removal, and the remaining first mask layer 300 after partial removal. The isolation layer 120 is continuously etched from the bottom of each third groove 230 to form the second trench 112, and the active region 101 is continuously etched from the bottom of each fourth groove 240 to form the third trench 113; the second mask layer 400 is completely removed in the foregoing etching process. The width of the fourth groove 240 is greater than that of the third groove 230, the third trench 113 is formed by continuously etching from the bottom of the fourth groove 240, and the second trench 112 is formed by continuously etching from the bottom of the third groove 230. Therefore, as shown in FIG. 10, the first width d1 of the third trench 113 is greater than the second width d2 of the second trench 112.

In one of the embodiments, as shown in FIG. 10, in the step of "forming second trenches 112 and third trenches 113", in this embodiment, a difference between the first width d1 of the third trench 113 and the second width d2 of the second trench 112 may be 1 nm to 5 nm, such as 1 nm, 2 nm, 3.5 nm, 5 nm, etc. In other embodiments, the difference between the first width d1 of the third trench 113 and the second width d2 of the second trench 112 may also be greater than 5 nm, such as 5.5 nm, which is not limited in this embodiment.

In one of the embodiments, as shown in FIG. 10, in the step of "forming second trenches 112 and third trenches 113", in this embodiment, the depth of the second trench 112 may be 180 nm to 200 nm, such as 180 nm, 190 nm, 195 nm, 200 nm, etc. In other embodiments, the depth of the second trench 112 may also be less than 180 nm or greater than 200 nm, such as 175 nm, 205 nm, etc., which is not limited in this embodiment.

In one of the embodiments, as shown in FIG. 10, in the step of "forming second trenches 112 and third trenches 113", in this embodiment, the depth of the third trench 113 may be 150 nm 170 nm, such 150 nm, 155 nm, 160 nm, 170 nm, etc. In other embodiments, the depth of the third trench 113 may also be less than 150 nm or greater than 170 nm, such as 145 nm, 175 nm, etc., which is not limited in this embodiment.

Figure 11:
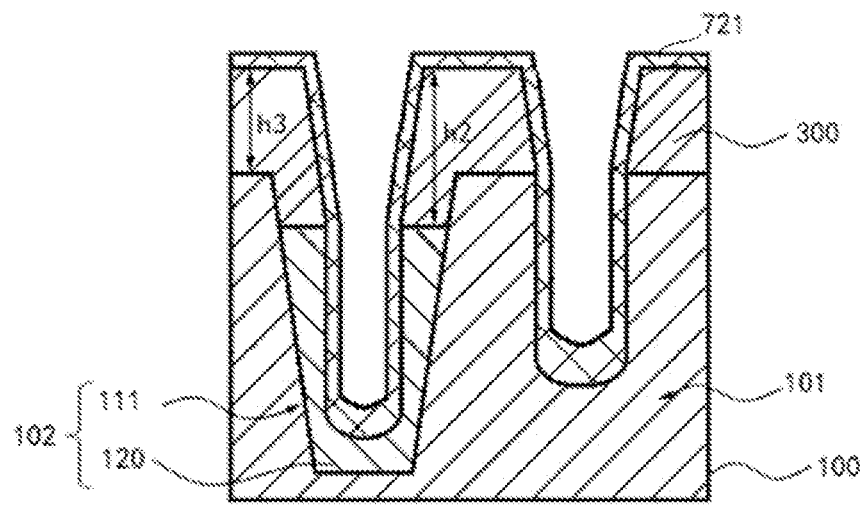
FIG. 11 to FIG. 14 are schematic diagrams of the semiconductor structure in other steps of the manufacturing method proposed by the present disclosure.
Figure 12:
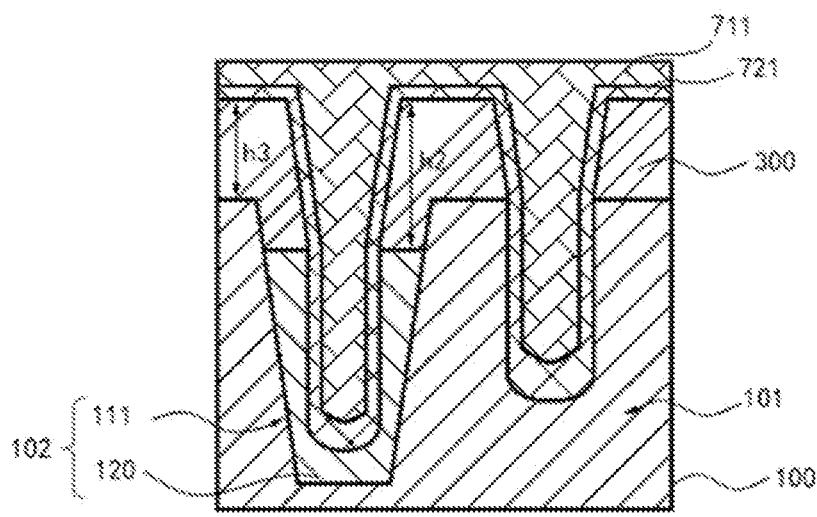
Figure 13:
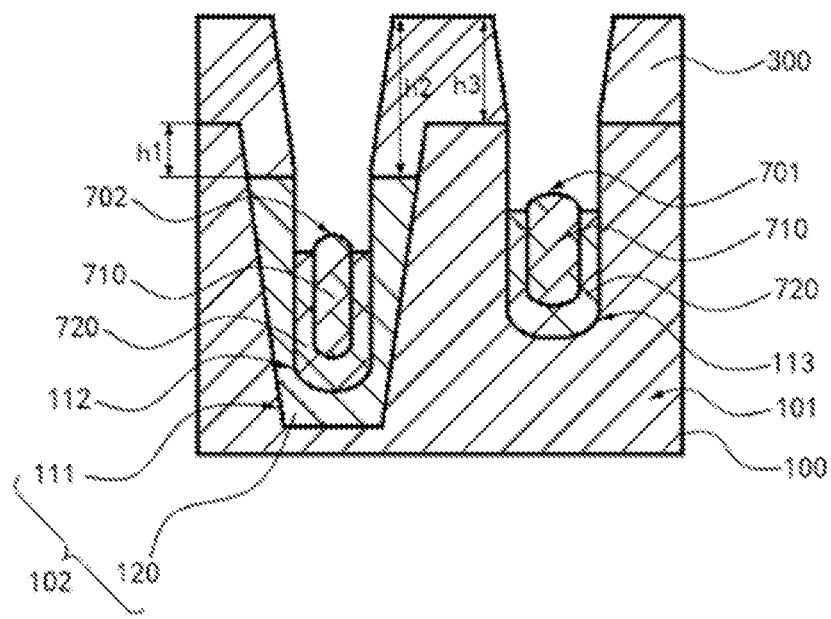

In one of the embodiments, in this embodiment, the step of forming word line structures in the second trenches 112 and the third trenches 113 includes:

as shown in FIG. 11, forming a metal barrier material layer 721, where the metal barrier material layer 721 covers the upper surface of the first mask layer 300, and the bottom and sidewalls of each of the second trenches 112 and the third trenches 113;

as shown in FIG. 12, forming a conductive material layer 711, where the conductive material layer 711 covers the surface of the metal barrier material layer, and the conductive material layer 711 fills the second trenches 112 and the third trenches 113; and as shown in FIG. 13, removing part of the metal barrier material layer 721 and part of the conductive material layer 711, where the remaining metal barrier material layer 721 is a barrier layer 720, and the remaining conductive material layer 711 is a conductive layer 710, the barrier layer 720 and the conductive layer 710 forming each of the word line structures;

where an upper surface of the barrier layer 720 and an upper surface of the conductive layer 710 are lower than the upper surface of each of the active regions 101.

Further, in the step of "forming the word line structures", in this embodiment, the upper surface of the barrier layer 720 is lower than the upper surface of the conductive layer 710. Thus, a gate-induced drain leakage (GIDL) can be reduced.

Further, in the step of "forming the word line structures", in this embodiment, after the step of forming word line structures in the second trenches 112 and the third trenches 113, the method further includes:

forming a protective layer 800, where the protective layer 800 covers the surface of each of the word line structures and fills the second trenches 112 and the third trenches 113.

FIG. 11 shows a schematic structural diagram of the semiconductor structure in the step of "forming a metal barrier material layer 721", and specifically shows a partial enlarged view of the semiconductor structure similar to FIG. 10. Specifically, the semiconductor structure in this step includes the substrate 100, the isolation layer 120, the first mask layer 300, and the metal barrier material layer 721. The metal barrier material layer 721 covers the upper surface of the first mask layer 300, and the bottom and sidewalls of each of the second trenches 112 and the third trenches 113.

FIG. 12 shows a schematic structural diagram of the semiconductor structure in the step of "forming a conductive material layer 711", and specifically shows a partial enlarged view of the semiconductor structure similar to FIG. 10. Specifically, the semiconductor structure in this step includes the substrate 100, the isolation layer 120, the first mask layer 300, the metal barrier material layer 721, and the conductive material layer 711. The conductive material layer 711 covers the surface of the metal barrier material layer, and the conductive material layer 711 fills the second trenches 112 and the third trenches 113.

FIG. 13 shows a schematic structural diagram of the semiconductor structure in the step of "forming word line structures", and specifically shows a partial enlarged view of the semiconductor structure similar to FIG. 10. Specifically, the semiconductor structure in this step includes the substrate 100, the isolation layer 120, the first mask layer 300, and the word line structures. The word line structures are formed in the second trenches 112 and the third trenches 113 respectively. Since the first width d1 of the third trench 113 is greater than the second width d2 of the second trench 112, the word line structure formed in the third trench 113 (i.e., the active word line 701) is greater than the width of the word line structure formed in the second trench 112 (i.e., the passing word line 702). In addition, each of the word line structures includes the conductive layer 710 and the barrier layer 720; the barrier layer 720 is formed between the conductive layer 710 and the wall of the trench.

In summary, in the manufacturing method of a semiconductor structure proposed by the present disclosure, a mask is covered on the substrate, and the mask thickness of the active regions is thinner than that of the isolation regions, such that the width of the word line trench formed in the isolation regions is less than the width of the word line trench formed in the active regions in the subsequent process, and the width of a passing word line is less than that of an active word line, thereby reducing the impact of the passing word line and the adverse influence of bit flipping.

Moreover, in order to verify the efficacy of the manufacturing method of a semiconductor structure proposed by the present disclosure and the manufactured semiconductor structure, the applicant conducted experiments. The experimental results show that when the depth of the first groove is 5 nm, there will be a width difference of 0.55 nm between the second trench and the third trench, and through numerous experiments, it is concluded the linear relationship between the depth of the first groove and the trench width difference is approximately 0.1 nm of width difference/1 nm of depth. In the actual production, the applicant made the depth of the first groove about 8 nm to 10 nm, and a trench width difference of about 1 nm was generated.

Based on the above detailed description of an exemplary embodiment of the manufacturing method of a semiconductor structure proposed by the present disclosure, an exemplary embodiment of the semiconductor structure proposed by the present disclosure is described below with reference to FIG. 13.

As shown in FIG. 13, in this embodiment, the semiconductor structure proposed by the present disclosure includes a substrate 100, where the substrate 100 includes active regions 101 and isolation regions 102, each of the isolation regions 102 includes a first trench 111 and an isolation layer 120 formed in the first trenches 111, each of the second trenches 112 is provided on an upper surface of the isolation layer 120, each of the third trenches 113 is provided on an upper surface of each of the active regions 101, a width of the third trench 113 is greater than that of the second trench 112, and word line structures are provided in the third trenches 113 and the second trenches 112 respectively.

Figure 14:
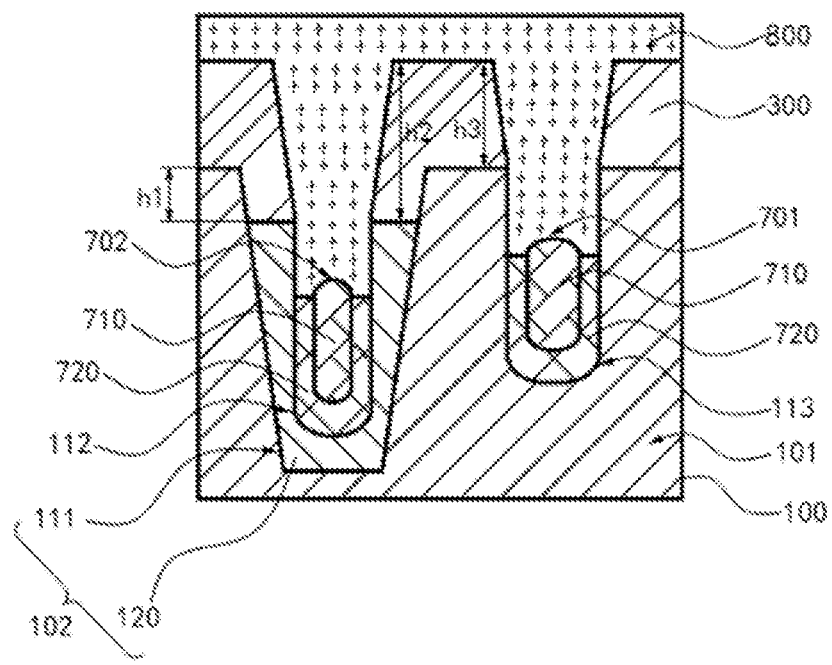

In one of the embodiments, as shown in FIG. 14, in this embodiment, the semiconductor structure further includes a protective layer 800, where the protective layer 800 covers the surfaces of the word line structures and fills the second trenches 112 and the third trenches 113.

In one of the embodiments, as shown in FIG. 13, in this embodiment, each of the word line structures includes a conductive layer 710 and a barrier layer 720. The conductive layer 710 is provided in each of the second trenches 112 and each of the third trenches 113. The barrier layer 720 is provided between the conductive layer 710 and the wall of each trench. An upper surface of the barrier layer 720 and an upper surface of the conductive layer 710 are lower than the upper surface of each of the active regions 101.

Further, based on the design that each word line structure includes the conductive layer 710, in this embodiment, a material of the conductive layer 710 may include tungsten (W).

Further, based on the design that each word line structure includes the barrier layer 720, in this embodiment, a material of the barrier layer 720 may include TiN.

In one of the embodiments, as shown in FIG. 13, in this embodiment, a material of the isolation layer 120 may include $SiO_2$.

In one of the embodiments, as shown in FIG. 13, in this embodiment, a material of the first mask layer 300 may include $Si_3N_4$.

In one of the embodiments, as shown in FIG. 13, in this embodiment, a first thickness h2 of a portion of the first mask layer 300 which covers the isolation layer 120 may be 15 nm to 30 nm, such as 15 nm, 20 nm, 25 nm, 30 nm, etc. In other embodiments, the first thickness h2 of the portion of the first mask layer 300 which covers the isolation layer 120 may also be less than 15 nm or greater than 30 nm, such as 14 nm, 35 nm, etc., which is not limited in this embodiment. In addition, taking a depth h1 of the first groove 210 being 3 nm to 10 nm and the first thickness h2 of the portion of the first mask layer 300 which covers the isolation layer 120 being 15 nm to 30 nm as an example, a second thickness h3 of a portion of the first mask layer 300 which covers the active regions 101 is approximately 5 nm to 27 nm.

In one of the embodiments, as shown in FIG. 13, in this embodiment, a difference between a first width d1 of the third trench 113 and a second width d2 of the second trench 112 may be 1 nm to 5 nm, such as 1 nm, 2 nm, 3.5 nm, 5 nm, etc. In other embodiments, the difference between the first width d1 of the third trench 113 and the second width d2 of the second trench 112 may also be greater than 5 nm, such as 5.5 nm, which is not limited in this embodiment.

In one of the embodiments, as shown in FIG. 13, in this embodiment, the depth of the second trench 112 may be 180 nm to 200 nm, such as 180 nm, 190 nm, 195 nm, 200 nm, etc. In other embodiments, the depth of the second trench 112 may also be less than 180 nm or greater than 200 nm, such as 175 nm, 205 nm, etc., which is not limited in this embodiment.

In one of the embodiments, as shown in FIG. 13, in this embodiment, the depth of the third trench 113 may be 150 nm 170 nm, such 150 nm, 155 nm, 160 nm, 170 nm, etc. In other embodiments, the depth of the third trench 113 may also be less than 150 nm or greater than 170 nm, such as 145 nm, 175 nm, etc., which is not limited in this embodiment.

In summary, in the semiconductor structure proposed by the present disclosure, the width of the word line trench formed in the isolation regions is less than the width of the word line trench formed in the active regions, and the width of a passing word line is less than that of an active word line, thereby reducing the impact of the passing word line and the adverse influence of bit flipping.

The present disclosure is described above with reference to several typical implementations. It should be understood that the terms used herein are intended for illustration, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A manufacturing method of a semiconductor structure, comprising:
providing a substrate, wherein the substrate comprises active regions and isolation regions, each of the isolation regions comprises a first trench and an isolation layer formed in the first trench, and a sacrificial layer is provided on the active regions;
removing part of the isolation layer to form first grooves;
forming a first mask layer, wherein the first mask layer covers upper surfaces of the active regions and fills the first grooves;
planarizing the first mask layer, such that an upper surface of a portion of the first mask layer located above the active regions is flush with an upper surface of a portion of the first mask layer located above the isolation regions;
removing part of the first mask layer, part of the isolation layer, and part of the substrate, to form second trenches and third trenches, wherein each of the second trenches is located in each of the isolation regions, each of the third trenches is located in each of the active regions, and a width of the third trench is greater than a width of the second trench; and forming word line structures in the second trenches and the third trenches; and, wherein the step of forming word line structures in the second trenches and the third trenches comprises:

forming a metal barrier material layer, wherein the metal barrier material layer covers an upper surface of the first mask layer, and a bottom and sidewalls of each of the second trenches and the third trenches;

forming a conductive material layer, wherein the conductive material layer covers a surface of the metal barrier material layer and fills the second trenches and the third trenches; and removing part of the metal barrier material layer and part of the conductive material layer, wherein the remaining metal barrier material layer is a barrier layer, and the remaining conductive material layer is a conductive layer, the barrier layer and the conductive layer forming each of the word line structures, wherein an upper surface of the barrier layer and an upper surface of the conductive layer are lower than upper surface of each of the active regions.

2. The manufacturing method of the semiconductor structure according to claim 1, wherein the second trench has a depth of 180 nm to 200 nm.

3. The manufacturing method of the semiconductor structure according to claim 1, wherein the third trench has a depth of 150 nm to 170 nm.

4. The manufacturing method of the semiconductor structure according to claim 1, wherein a difference between the width of the third trench and the width of the second trench is 1 nm to 5 nm.

5. The manufacturing method of the semiconductor structure according to claim 1, wherein the step of forming the first grooves comprises:

removing the sacrificial layer and part of the isolation layer by an etching process, such that an upper surface of the isolation layer is lower than upper surfaces of the active regions.

6. The manufacturing method of the semiconductor structure according to claim 1, wherein a material of the first mask layer comprises Si3N4.

7. The manufacturing method of the semiconductor structure according to claim 1, wherein the first mask layer has a thickness of 15 nm to 30 nm.

8. The manufacturing method of the semiconductor structure according to claim 1, wherein the first mask layer is formed by an atomic layer deposition process.

9. The manufacturing method of the semiconductor structure according to claim 1, wherein the step of planarizing the first mask layer comprises:

planarizing the first mask layer by a chemical-mechanical polishing process.

10. The manufacturing method of the semiconductor structure according to claim 1, wherein the step of removing part of the first mask layer, part of the isolation layer, and part of the substrate, to form second trenches and third trenches comprises:

forming a second mask layer on the first mask layer, wherein the second mask layer covers a surface of the first mask layer;

forming a patterned photoresist layer on the second mask layer; and etching part of the first mask layer, part of the isolation layer, and part of the substrate by using the patterned photoresist layer as a mask.

11. The manufacturing method of the semiconductor structure according to claim 10, wherein the step of forming a patterned photoresist layer on the second mask layer comprises:

forming a photoresist material layer on the second mask layer; and removing part of the photoresist material layer by using an exposure and development technology, wherein the remaining photoresist material layer forms the patterned photoresist layer.

12. The manufacturing method of the semiconductor structure according to claim 10, wherein the step of etching part of the first mask layer, part of the isolation layer, and part of the substrate by using the patterned photoresist layer as a mask comprises:

etching part of the second mask layer by using the patterned photoresist layer as a mask, to form fourth trenches in the second mask layer;

removing the patterned photoresist layer;

etching part of the first mask layer, part of the isolation layer, and part of the substrate downward along the fourth trenches; and removing the second mask layer.

13. The manufacturing method of the semiconductor structure according to claim 1, wherein
the upper surface of the barrier layer is lower than the upper surface of the conductive layer.

14. The manufacturing method of the semiconductor structure according to claim 1, after the step of forming word line structures in the second trenches and the third trenches, the method further comprises:

forming a protective layer, wherein the protective layer covers surfaces of the word line structures and fills the second trenches and the third trenches.

15. A semiconductor structure, comprising:

a substrate, comprising active regions and isolation regions, wherein each of the isolation regions comprises a first trench and an isolation layer formed in the first trench;

second trenches and third trenches, wherein each of the second trenches is located in each of the isolation regions, each of the third trenches is located in each of the active regions, and a width of the third trench is greater than a width of the second trench; and word line structures, wherein the word line structures are provided in the second trenches and the third trenches, and a width of the word line structures in the second trenches is about unified.

16. The semiconductor structure according to claim 15, wherein an upper surface of the isolation layer is lower than upper surfaces of the active regions.

17. The semiconductor structure according to claim 16, wherein each of the word line structures comprise a barrier layer and a conductive layer, and an upper surface of the barrier layer and an upper surface of the conductive layer are lower than the upper surface of each of the active regions.

18. The semiconductor structure according to claim 17, further comprising:

a protective layer, wherein the protective layer covers surfaces of the word line structures and fills the second trenches and the third trenches.

19. A manufacturing method of a semiconductor structure, comprising:

providing a substrate, wherein an active region is formed in the substrate and isolated by an isolation layer, and a sacrificial layer is provided on the active region;

removing part of the isolation layer to form an upper surface of the isolation layer lower than an upper surface of the active region;

forming a first mask layer with a planar upper surface on the substrate, wherein a part of the first mask layer on the isolation layer is thicker than a part of the first mask layer on the active region;

patterning the first mask layer to form a trench pattern on the isolation layer and the active region, wherein an upper opening's width of trench pattern is about unified, and a lower opening's width of the trench pattern on the active region is greater than a lower opening's width of the trench pattern on the isolation layer;

transferring the trench pattern of the first mask layer to the substrate for forming a second trench and a third trench, wherein the second trench is located in the isolation layer, the third trench is located in the active region, and a width of the third trench is greater than a width of the second trench.

\* \* \* \* \*